United States Patent
Chuang et al.

(10) Patent No.: US 8,742,492 B2
(45) Date of Patent: Jun. 3, 2014

(54) DEVICE WITH A VERTICAL GATE STRUCTURE

(75) Inventors: Hak-Lay Chuang, Singapore (SG); Ming Zhu, Singapore (SG); Yi-Ren Chen, Guishan Township, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/568,997

(22) Filed: Aug. 7, 2012

(65) Prior Publication Data

US 2014/0042524 A1 Feb. 13, 2014

(51) Int. Cl.
*H01L 29/66* (2006.01)
(52) U.S. Cl.
USPC .......... 257/329; 257/331; 257/E29.118; 257/E29.122; 257/E29.131

(58) Field of Classification Search
USPC ............. 257/329, 331, E29.118, E29.122, 257/E29.131
See application file for complete search history.

(56) References Cited

U.S. PATENT DOCUMENTS

| 2008/0308908 | A1* | 12/2008 | Otake | 257/615 |
| 2011/0115011 | A1* | 5/2011 | Masuoka et al. | 257/314 |
| 2011/0315950 | A1* | 12/2011 | Sleight et al. | 257/9 |

\* cited by examiner

*Primary Examiner* — Victor A Mandala
(74) *Attorney, Agent, or Firm* — Haynes and Boone, LLP

(57) ABSTRACT

A device includes a wafer substrate, a conical frustum structure formed in the wafer substrate, and a gate all-around (GAA) structure circumscribing the middle portion of the conical frustum structure. The conical frustum structure includes a drain formed at a bottom portion of the conical frustum, a source formed at a top portion of the vertical conical frustum, and a channel formed at a middle portion of the conical frustum connecting the source and the drain. The GAA structure overlaps with the source at one side of the GAA structure, crosses over the channel, and overlaps with the drain at another side of the GAA structure.

19 Claims, 18 Drawing Sheets

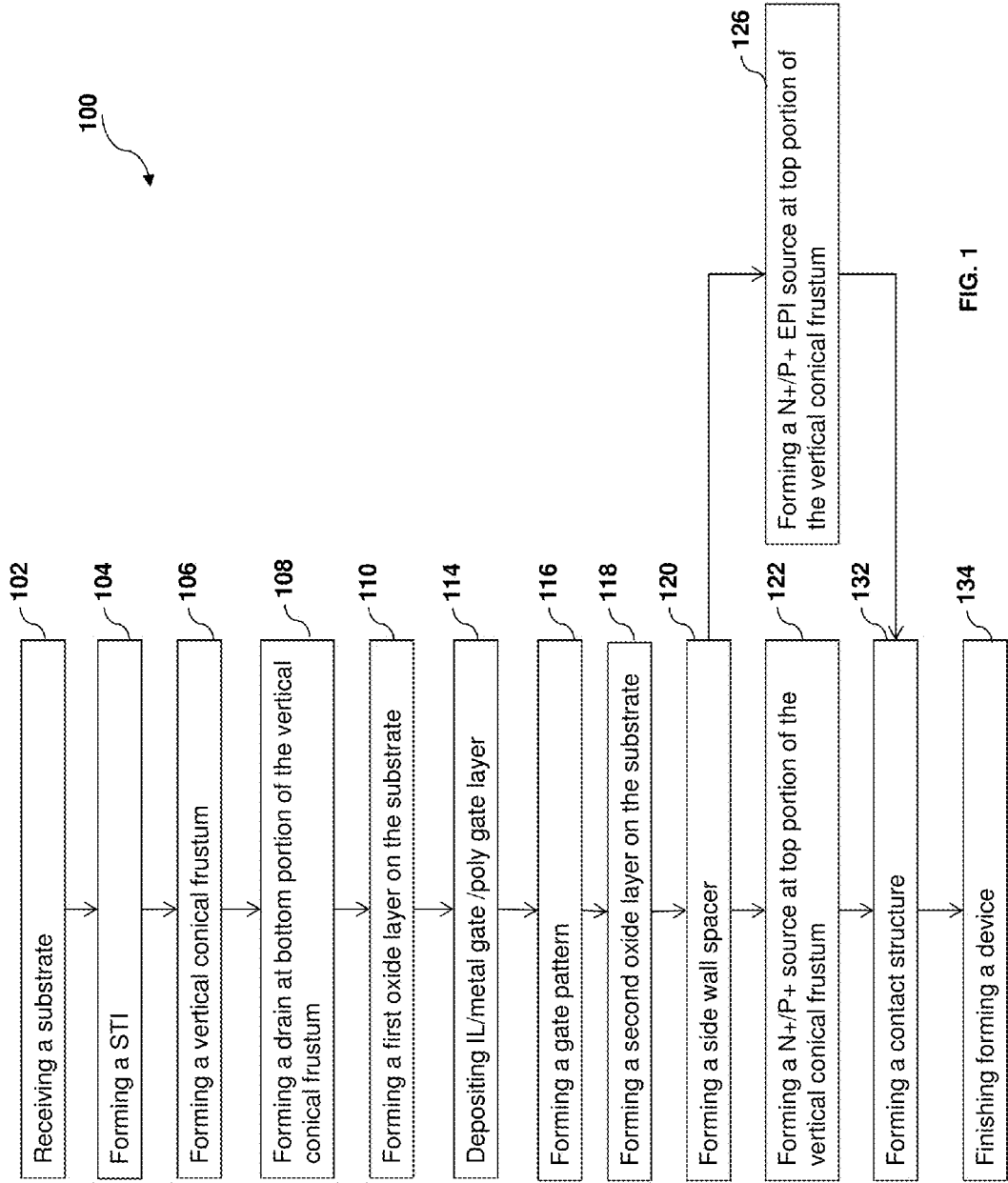

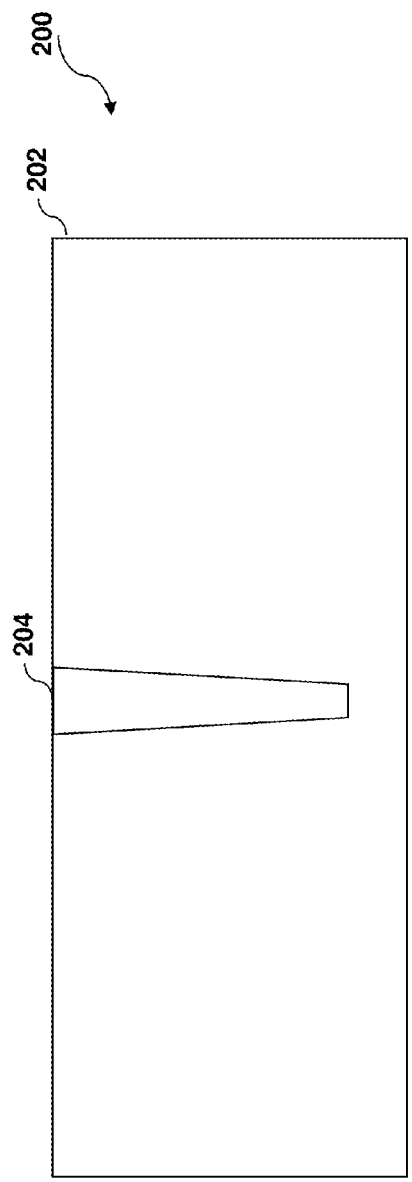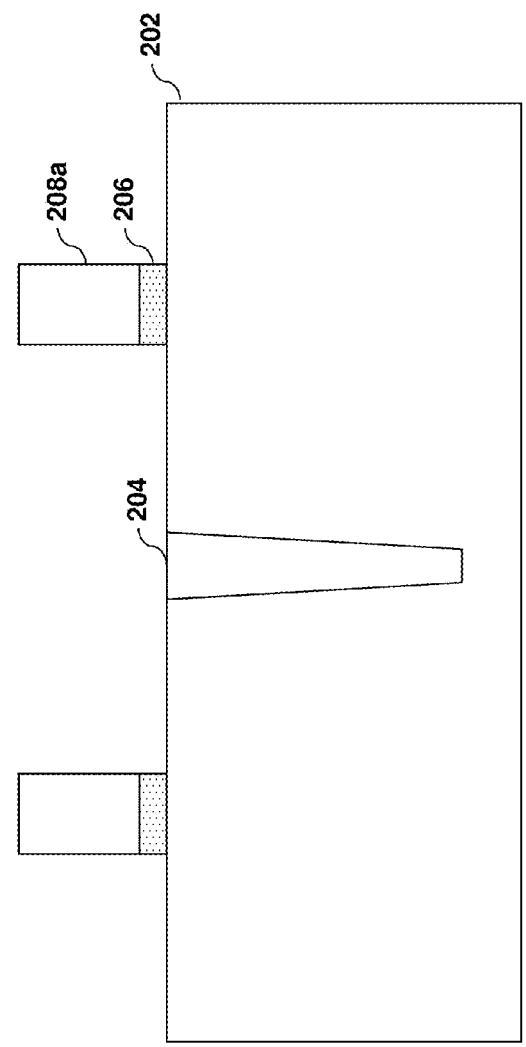

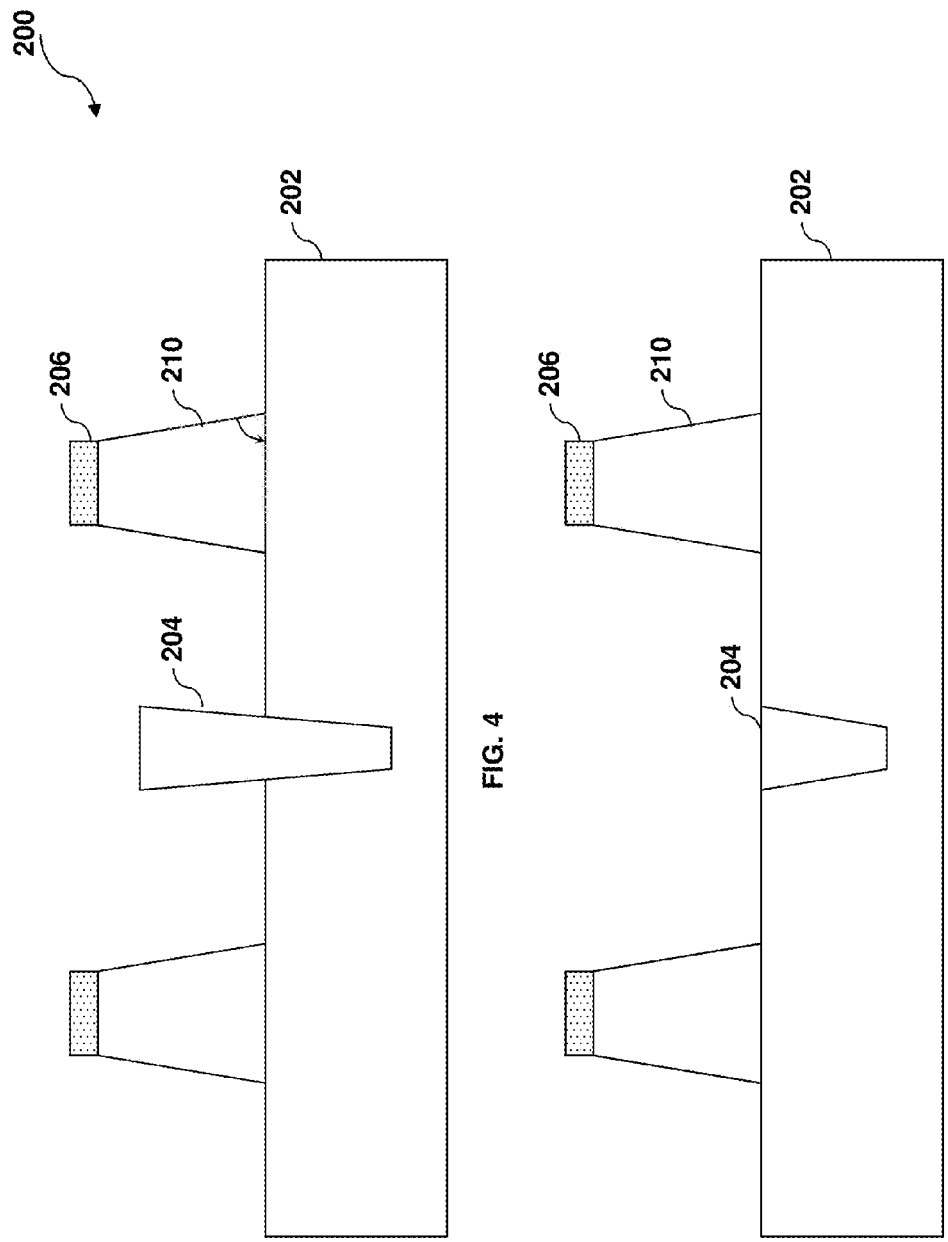

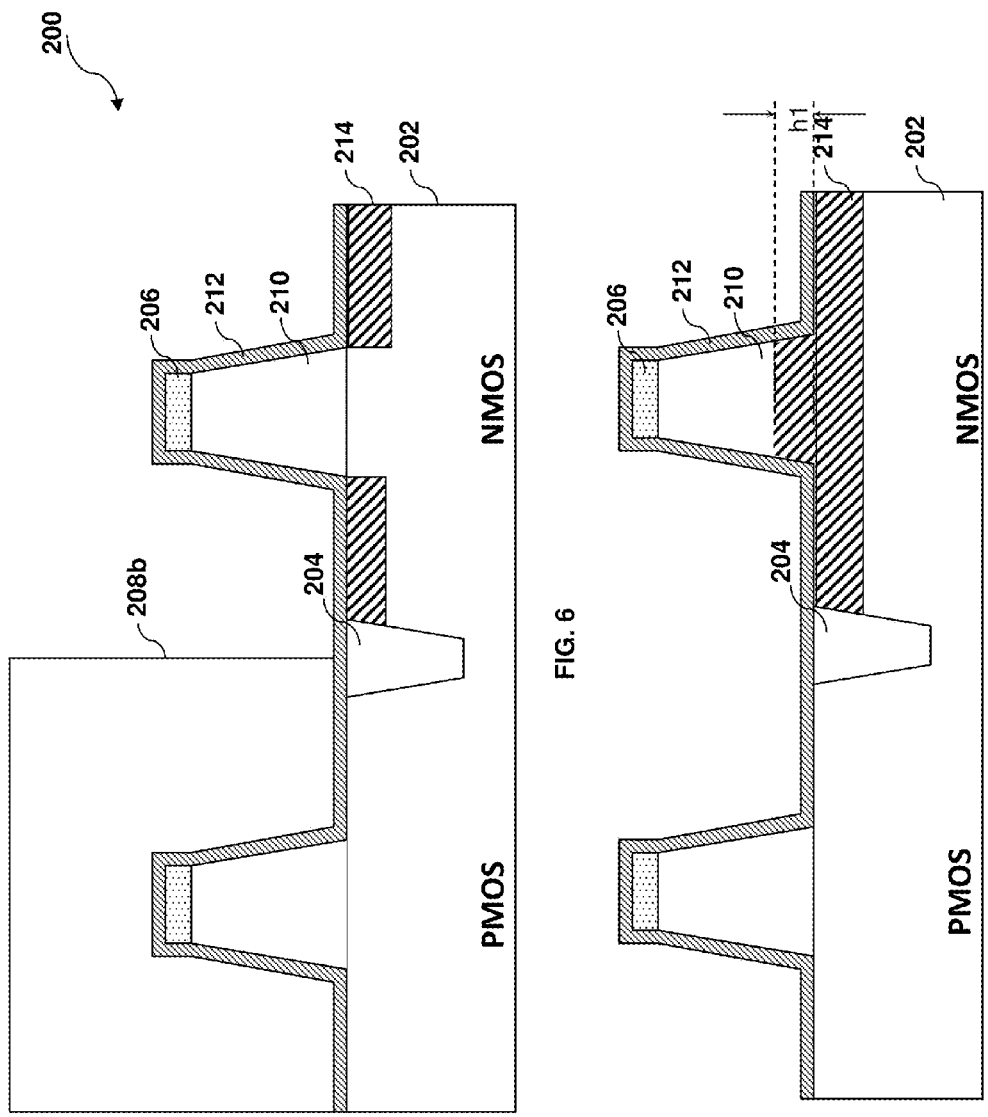

DEVICE WITH A VERTICAL GATE STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, the scaling down of a conventional complementary metal oxide semiconductor (CMOS) transistor faces challenges of rapidly increasing power consumption due to an off-state current leakage. The off-state current leakage is caused by the decreasing thickness of a gate oxide film associated with the scaling down of the CMOS transistor. Accordingly, what is needed is a method or device for further scaling down of a transistor.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIG. 1 is a flow chart of a method of fabricating a device for implementing one or more embodiments of the present disclosure.

FIGS. 2-21 are cross sectional views of fabricating a device for implementing one or more embodiments of the present disclosure.

DETAILED DESCRIPTION

Figure 8:
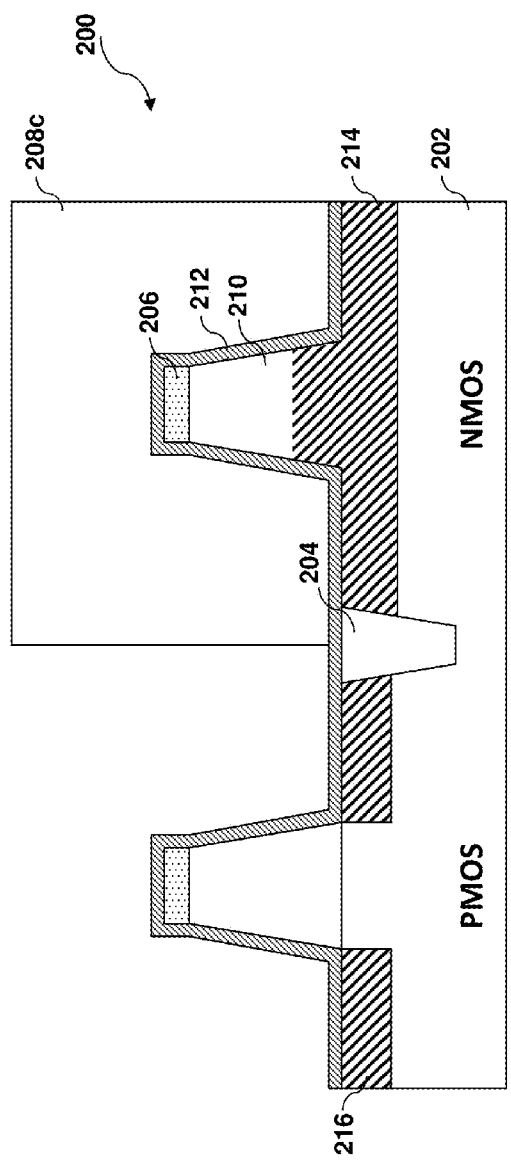

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, a flow chart of a method 100 of fabricating a device is illustrated according to one or more embodiments of the present disclosure. FIGS. 2-21 are cross sectional views of fabricating a device 200 using the method 100 for implementing one or more embodiments. In the present embodiments, a device is also referred to as a structure or a cell. The method 100 begins at step 102 by receiving a wafer substrate 202. In some embodiments, the wafer substrate 202 includes a wafer and/or a plurality of conductive and non-conductive thin films. The wafer is a semiconductor substrate including silicon (in other words, a silicon wafer). Alternatively or additionally, the wafer includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). The plurality of conductive and non-conductive thin films may comprise an insulator or a conductive material. For example, the conductive material comprises a metal such as aluminum (Al), copper (Cu), tungsten (W), nickel (Ni), titanium (Ti), gold (Au), and platinum (Pt) and, thereof an alloy of the metals. The insulator material may include silicon oxide and silicon nitride. The wafer substrate 202 may further include various doped features, such as n-type wells and/or p-type wells, formed by ion implantation or diffusion.

The method 100 proceeds to step 104 by forming a shallow trench isolation (STI) structure 204 in the wafer substrate 202 as shown in FIG. 2. The step 104 includes using a lithography process to form a resist pattern on the wafer substrate 202. The step 104 also includes etching the wafer substrate 202 with the resist pattern formed as a mask using an etching process to form a trench in the wafer substrate 202. The step 104 further includes depositing an oxide to fill up the trench in the wafer substrate 202. The step 104 furthermore includes using a chemical mechanical polishing (CMP) process to remove the oxide outside the trench to form the STI structure 204 in the wafer substrate 202 as shown in FIG. 2. The step 104 may include a cleaning process to strip the resist pattern and/or clean a surface of the substrate 202 before or after each process. The STI structure 204 includes a silicon oxide, a silicon nitride, or other oxide material. The STI structure 204 divides the wafer substrate 202 in two areas, a negative charge metal oxide semiconductor (NMOS) area and a positive charge metal oxide semiconductor (PMOS) area to be discussed further below with reference to FIGS. 6-9.

The method 100 proceeds to step 106 by forming a vertical conical frustum on the wafer substrate 202 as shown in FIG. 5. The step 106 includes depositing a hard mask layer 206 on the wafer substrate 202. The step 106 also includes using a lithography process to form a resist pattern 208a on the wafer substrate 202 and then using an etching process to form a patterned hard mask layer 206 on the wafer substrate 202 as shown in FIG. 3. The step 106 includes using a cleaning process to strip the resist pattern 208. The step 106 also includes etching the patterned hard mask layer 206 to form a vertical conical frustum 210 integrated in the substrate 202 as shown in FIG. 4. The step 106 further includes using an etching process to remove the partial STI structure 204 on the wafer substrate 202 to substantially same level as the surface of the wafer substrate 202 as shown in FIG. 5. The hard mask layer 206 may include a silicon nitride. Other hard mask material may be also possible. The hard mask layer 206 may also include a silicon oxide layer between the silicon nitride and the wafer substrate 202 to improve a stress caused by the silicon nitride.

As shown in FIG. 5, a profile of the vertical conical frustum 210 is proposed to be a trapezoid shape by the etching process. A top view of the vertical conical frustum 210 is in a circular (round) shape. In some embodiments, a bottom corner angle of the vertical conical frustum 210 ranges from approximate 45 to 90 degree)(°). In other embodiments, a height of the vertical conical frustum 210 ranges from approximate 50 to 200 nanometer (nm).

Figure 9:
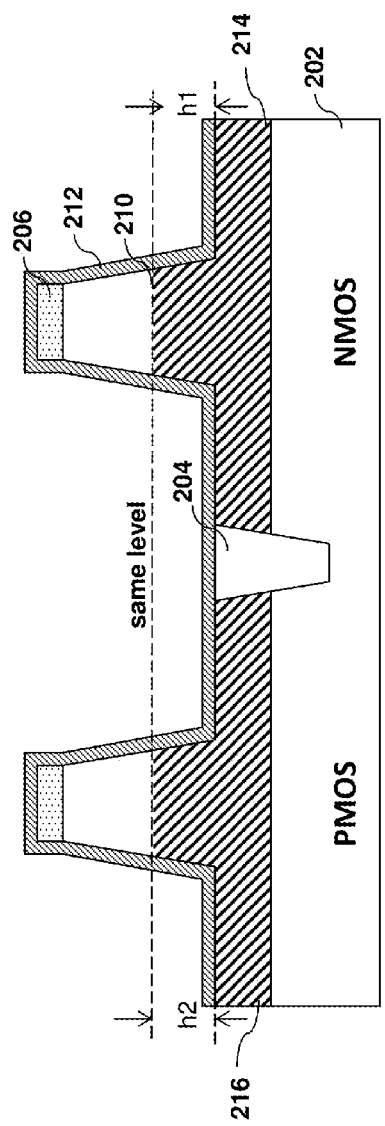

The method 100 proceeds to step 108 by forming a drain at bottom of the vertical conical frustum 210. The step 108 includes depositing a screen layer 212 over the wafer substrate 202 shown in FIG. 6. The step 212 also includes forming a resist pattern to define an area of the drain of the NMOS or the PMOS using a lithography process. In one embodiment, the step 108 includes forming a resist pattern 208b on the wafer substrate 202 to define the NMOS area using the lithography process. The step 108 also includes performing an ion implantation process to allow a N+ dopant penetrating the screen layer 212 to form a N+ drain 214 of the NMOS at a bottom area of the vertical conical frustum 210 in the NMOS area as shown in FIG. 6. Following the ion implantation, the step 108 also includes performing a thermal anneal process, such as a rapid thermal anneal (RTA) process or a diffusion process to allow the N+ dopant to merge/raise to form the N+ drain 214 of the NMOS at a bottom portion of the vertical conical frustum 210 as shown in FIG. 7. A raising height h1 of the N+ dopant depends in the vertical frustum 210 depends on N+ dopant concentration and a RAT process and is adjustable per device. In another embodiment, the step 108 includes forming a resist pattern 208c on the wafer substrate 202 to define the PMOS area using a lithography process. The step 108 also includes performing an ion implantation process to allow a dopant penetrating the screen layer 212 to form a P+ drain 216 at bottom area of the vertical conical frustum 210 in the PMOS area as shown in FIG. 8. Following the ion implantation, the step 108 also includes performing a thermal anneal process, such as a RTA process or a diffusion process to allow the P+ dopant to merge/raise to form the P+ drain 214 of the PMOS at a bottom portion of the vertical conical frustum 210 as shown in FIG. 9. A raising height h2 of the P+ dopant depends in the vertical frustum 210 depends on P+ dopant concentration and a RAT process and is adjustable per device. The raising height h2 of the P+ dopant should be the same as the raising height h1 of the N+ dopant as shown in FIG. 9. The step 108 may also include a cleaning process to strip the resist pattern 208b or 208c after the ion implantation process. The step 108 furthermore includes removing the screen layer 210 using an etching process. Damage caused by the ion plantation may be also removed by the etching process when removing the screen layer 210.

As shown in FIGS. 6-9, the screen layer 212 is used to protect the side wall of the vertical conical frustum 210 from the ion implantation process. The screen layer 212 may include a silicon oxide. A thickness of the screen layer 212 ranges from approximate 20 to 50 nm. In one embodiment, the N+ drain 214 is formed first and then the P+ drain 216 is formed. In another embodiment, the P+ drain 216 is formed first and then the N+ drain 214 is formed. Additional materials, thicknesses, and sequences can be used to provide different advantages, and no particular advantage is necessarily required of any embodiment. In some embodiments, a level of the N+ drain 214 of the NMOS at the bottom portion of the vertical conical frustum 210 and a level of the P+ drain 216 of the PMOS at the bottom portion of the vertical conical frustum 210 may be at substantially same level as shown in FIG. 9.

Figure 10:
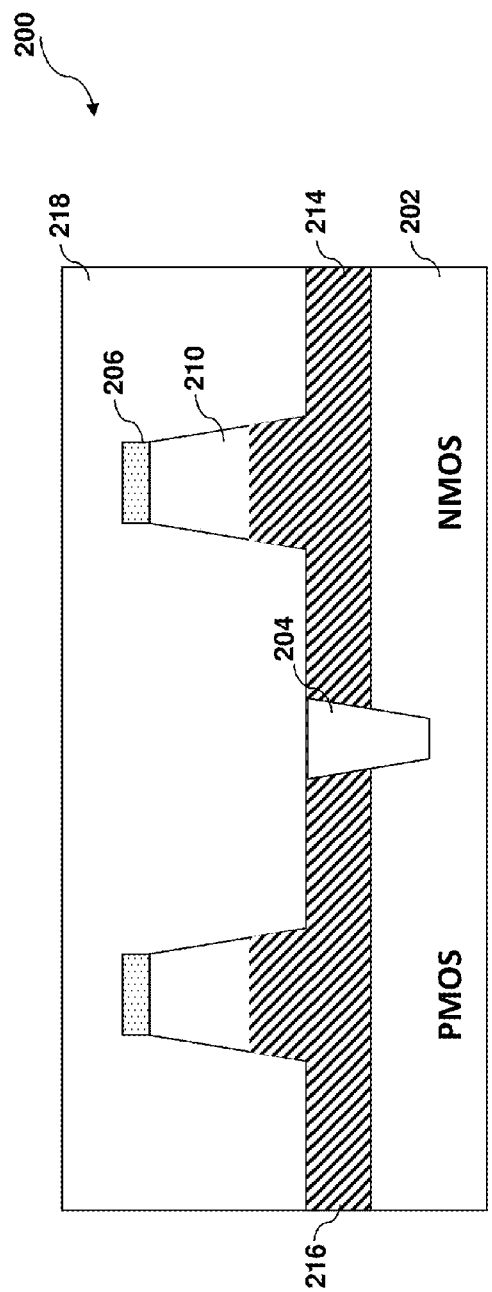
Figure 11:
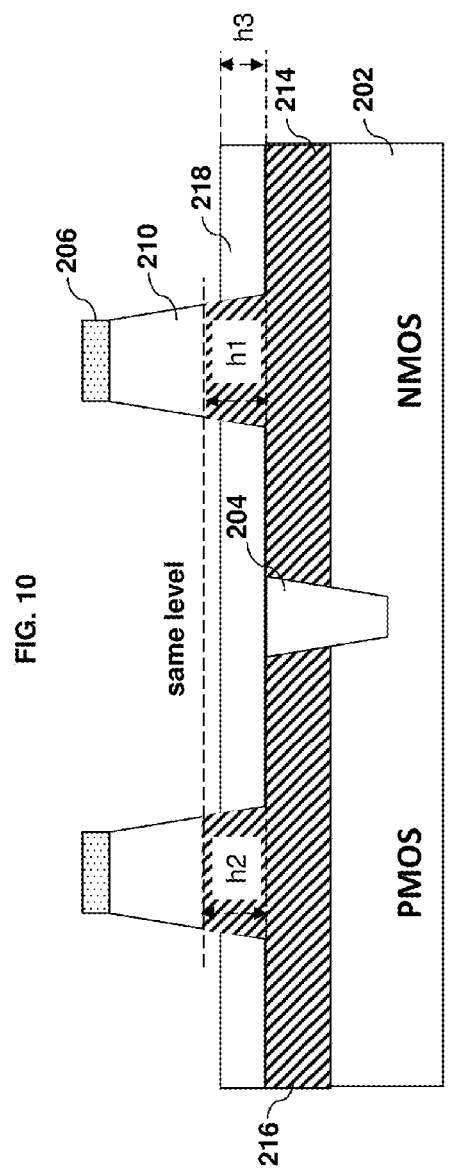

The method 100 proceeds to step 110 by forming a first oxide layer 218 over the wafer substrate 202 as shown in FIGS. 10-11. The step 110 includes depositing the first oxide layer 218 over the substrate 202. The first oxide layer 218 covers the vertical conical frustum 210 formed in the wafer substrate 202 and the hard mask layer 206 deposited on the top of the vertical conical frustum 210 as shown in FIG. 10. The step 110 also includes performing a CMP process on top of the first oxide layer 218. The CMP process stops at the hard mask layer 206 deposited on the top of the vertical conical frustum 210. The step 110 further includes etching the first oxide layer 218 deposited over the wafer substrate 202 using an etching process. A remaining thickness h3 of the oxide layer 218 is less than the raising height h1 of the N+ drain 214 of the NMOS and less than the raising height h2 of the P+ drain 216 of the PMOS as shown in FIG. 11, so that a gate below with reference to FIGS. 12-13 can overlap with the N+ drain 214 of the NMOS or the P+ drain 216 of the PMOS. In one embodiment, the first oxide layer 218 includes a silicon oxide. The first oxide layer 218 may include other materials.

Figure 12A:
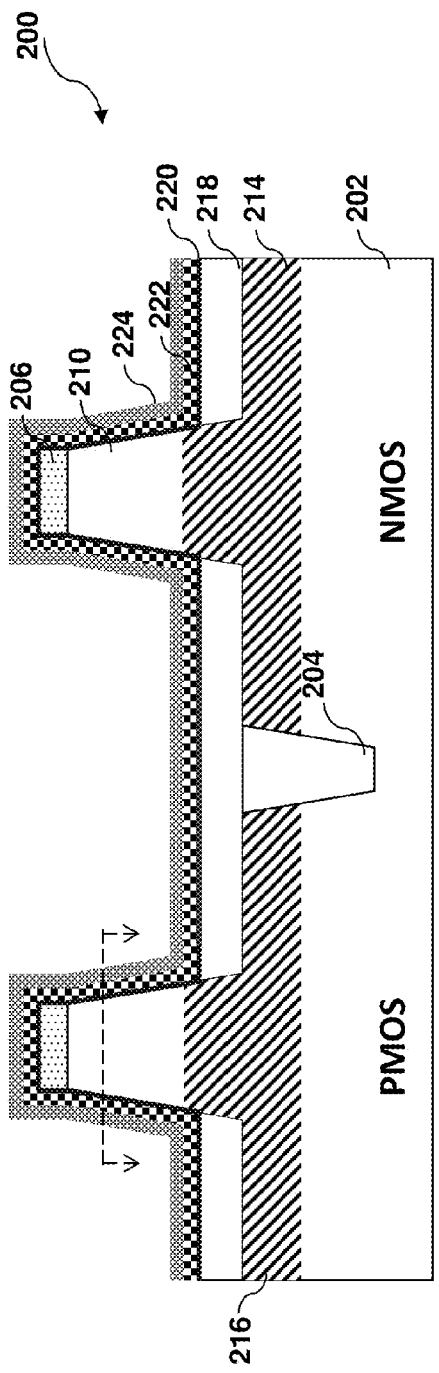
Figure 12B:
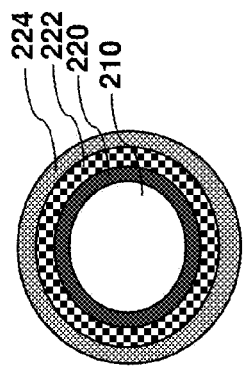

The method 100 proceeds to step 114 by depositing a stack of a gate all-around (GAA) layers over the surface of the wafer substrate 202 as shown in FIG. 12A. In the present embodiments, the trapezoidal profile of the vertical conical frustum 210 helps the GAA layers to properly deposit on the sidewalls of the vertical conical frustum. The step 114 includes depositing an interfacial layer (IL) 220 on the oxide layer 218 deposited on the wafer substrate 202. The step 114 also includes depositing a gate layer on the interfacial (IL) 220. The gate layer may include a metal layer 222 on the interfacial layer (IL) 220. The step 114 further includes depositing a poly gate layer 224 over the metal gate layer 222. FIG. 12B is a top view of the stack of the GAA layers. The vertical conical frustum 210 is circumscribed by the interfacial layer 220, the interfacial layer 220 is circumscribed by the metal layer 222, and the metal layer 222 is circumscribed by the poly gate layer 224. In the present embodiments, a vertical gate can be formed around the vertical conical frustum 210.

In one embodiment, the interfacial layer (IL) 220 includes a silicon oxide. In other embodiments, the interfacial layer (IL) 220 may include high-k dielectric materials, such as $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. The metal gate layer 222 may include a metal or a metal alloy, such as TiN, TaN, $ZrSi_2$, $MoSi_2$, $TaSi_2$, $NiSi_2$, and WN. The poly gate layer 224 may include a polysilicon or amorphous silicon.

Figure 13:
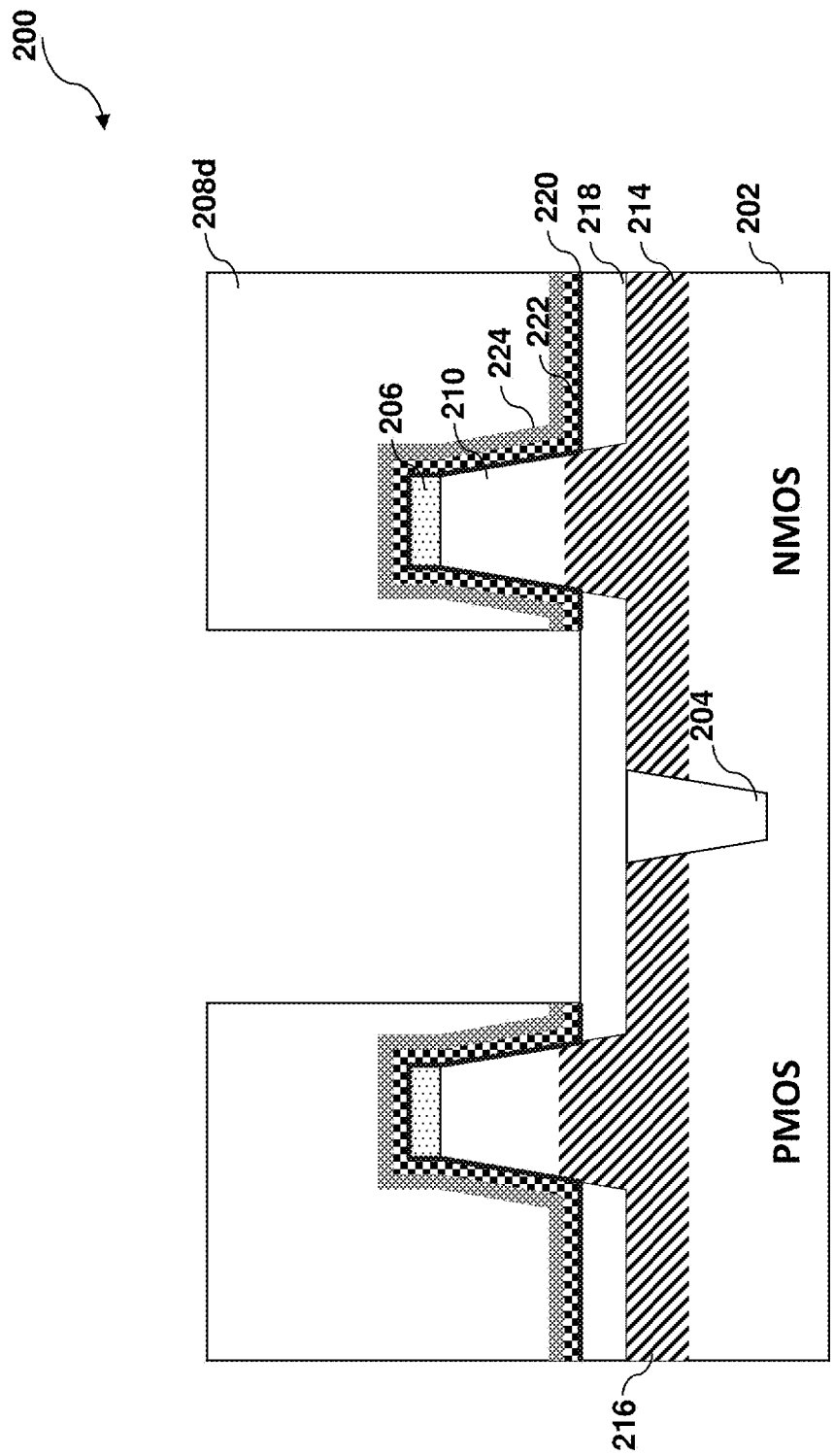

The method 100 proceeds to step 116 by forming a gate pattern as shown in FIG. 13. The step 116 includes forming a resist pattern 208d using a lithography process. The step 116 also includes using a gate mask. The step 116 further includes etching away the poly gate layer 224, the metal gate layer 222, and the interfacial layer (IL) 220 using an etching process. The etching stops at the first oxide layer 218 as shown in FIG. 13. The step 116 further includes a cleaning process to strip the resist after the etching process.

Figure 14:
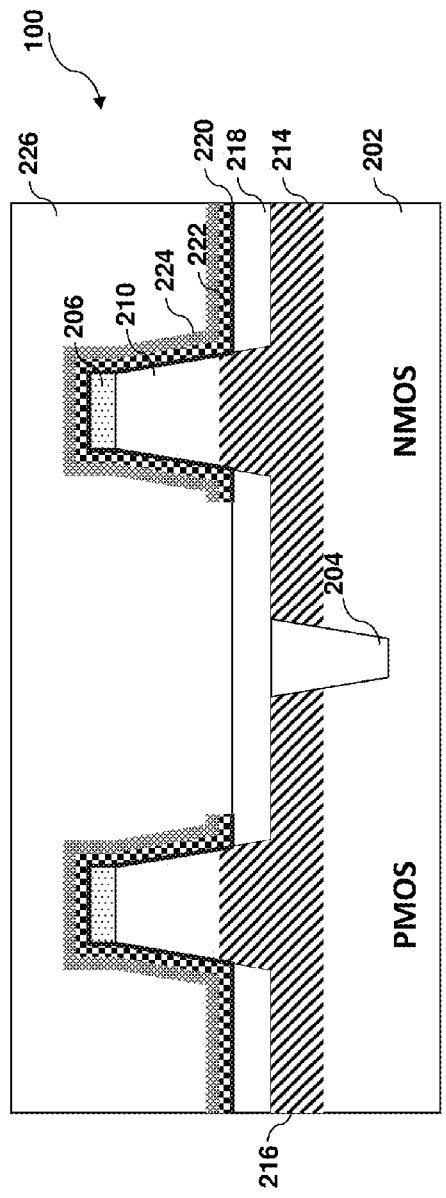
Figure 15:
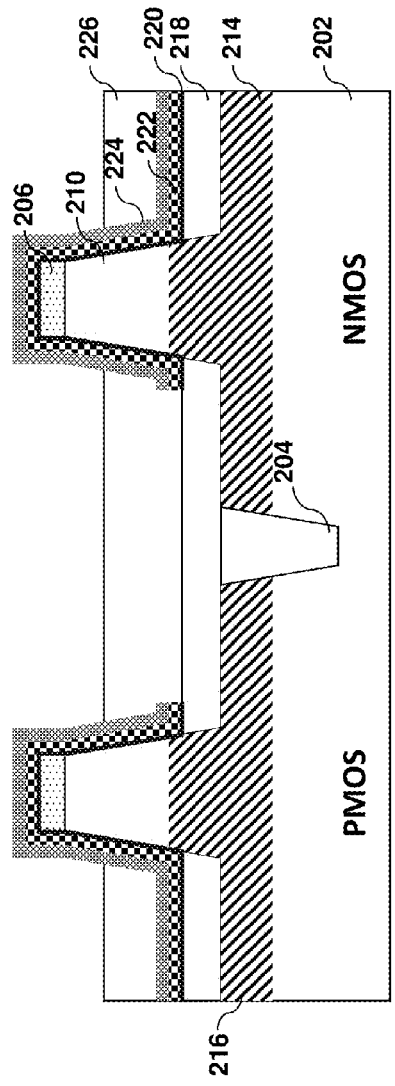

The method 100 proceeds to step 118 by forming a second oxide film 226 over the wafer substrate 202 as shown in FIGS. 14-15. The step 118 includes depositing a second oxide layer 226 over the substrate 202 shown in FIG. 14. The step 118 also includes using a CMP process to remove a portion of the second oxide layer 226. The CMP process stops at the top of the poly gate layer 224. The step 118 further includes removing another portion of the second oxide layer 226 using an etching process. A surface level of the remained second oxide layer 226 is lower than an interface between vertical conical frustum 210 and the hard mask layer 206 as shown in FIG. 15. In one embodiment, the second oxide layer 226 includes a silicon oxide. The second oxide layer 226 may include other materials.

Figure 16:
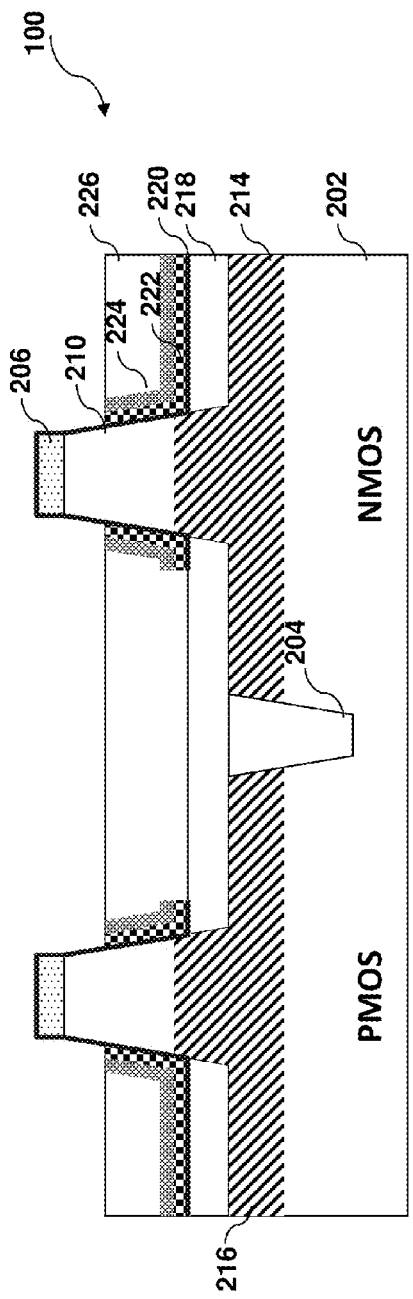
Figure 17:
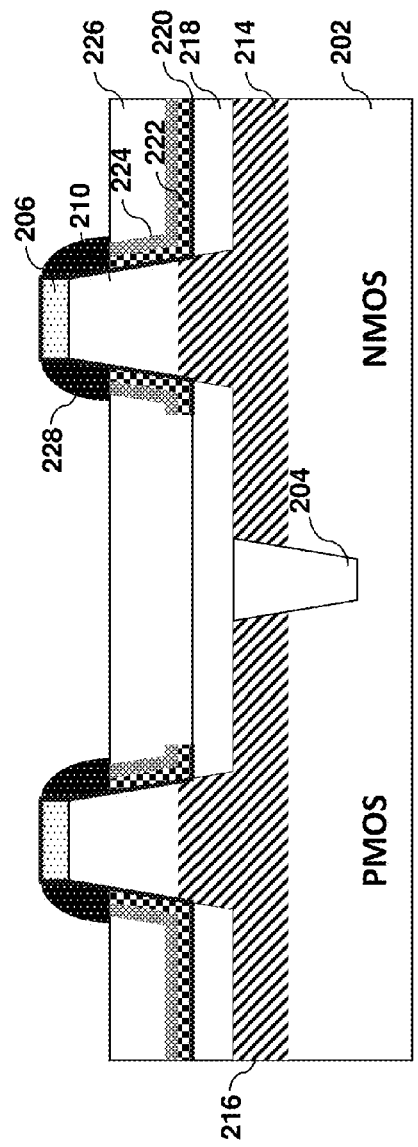
Figure 18:
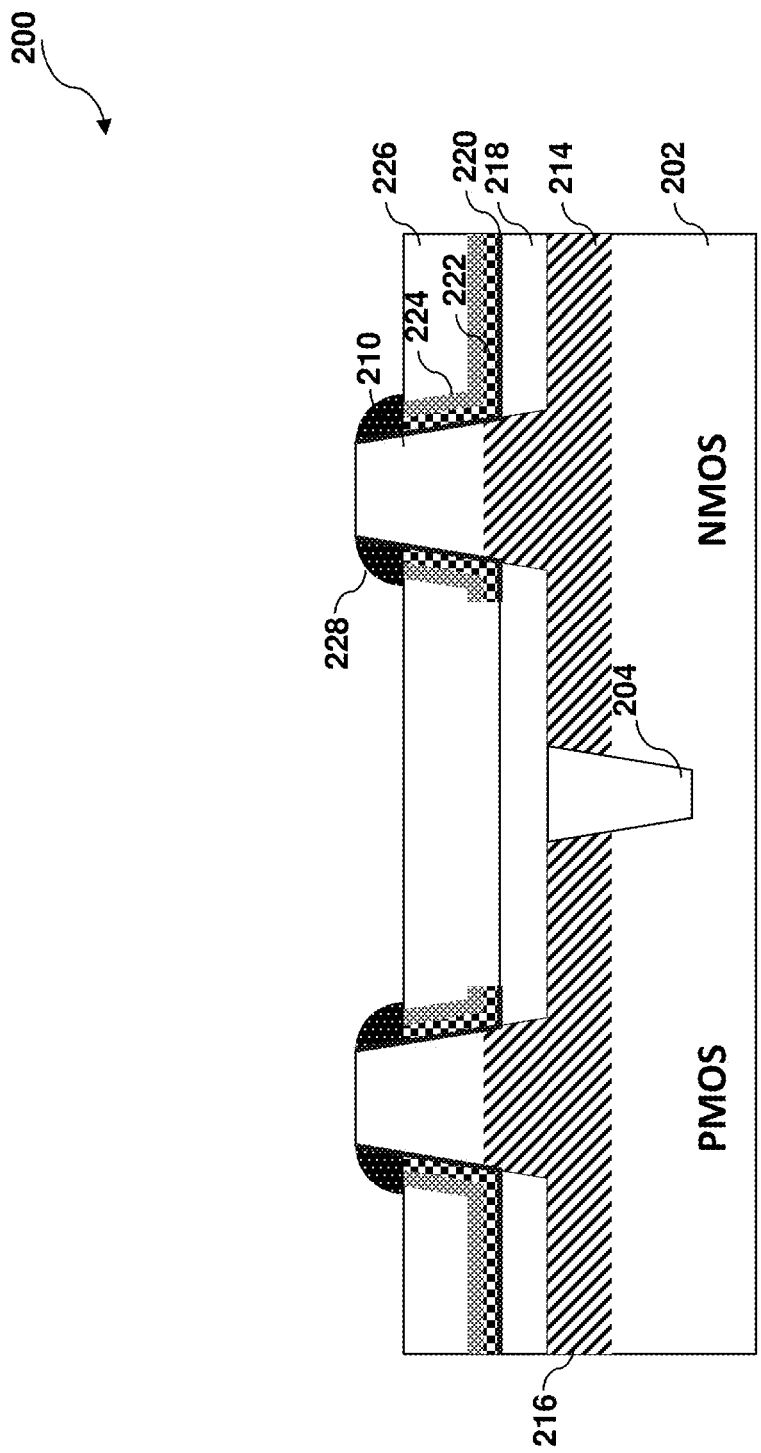

The method 100 proceeds to step 120 by forming a sidewall spacer 228 at the top portion of the vertical conical frustum 210 as shown in FIGS. 16-18. The step 120 includes removing the poly gate layer 224 and the metal gate layer 222 on the top portion of the vertical conical frustum 210 (not buried in the second oxide layer 226) using an etching process. The etching process stops at the interfacial layer 220 as shown in FIG. 16. The step 120 also includes depositing a spacer layer on the second oxide layer 226. The step 120 further includes etching the spacer layer deposited on the second oxide layer 226 using an etching process to form the sidewall spacer 228 at the top portion of the vertical conical frustum 210 as shown in FIG. 17. The step 120 furthermore includes removing the hard mask layer 206 deposited on top of the vertical conical frustum 210 and the interfacial layer (IL) 220 deposited on the hard mask layer 206 using a photo resist etch back process as shown in FIG. 18. In one embodiment, the sidewall spacer 228 includes a silicon nitride. The sidewall spacer 228 may include other materials.

Figure 19:
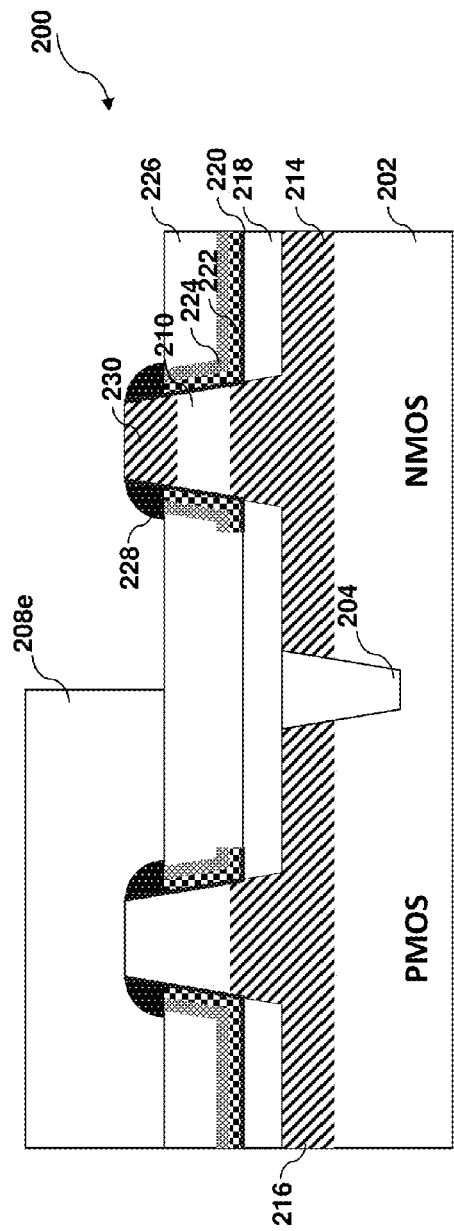
Figure 20:
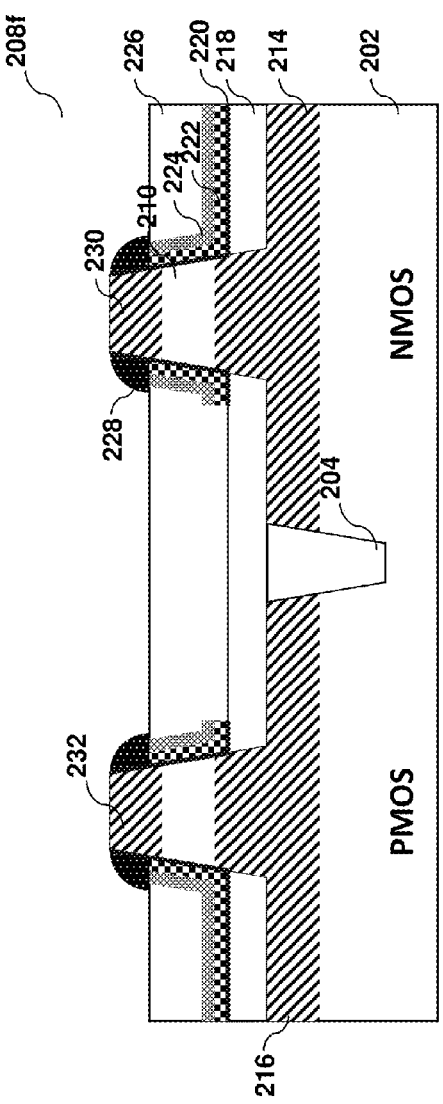
Figure 21:
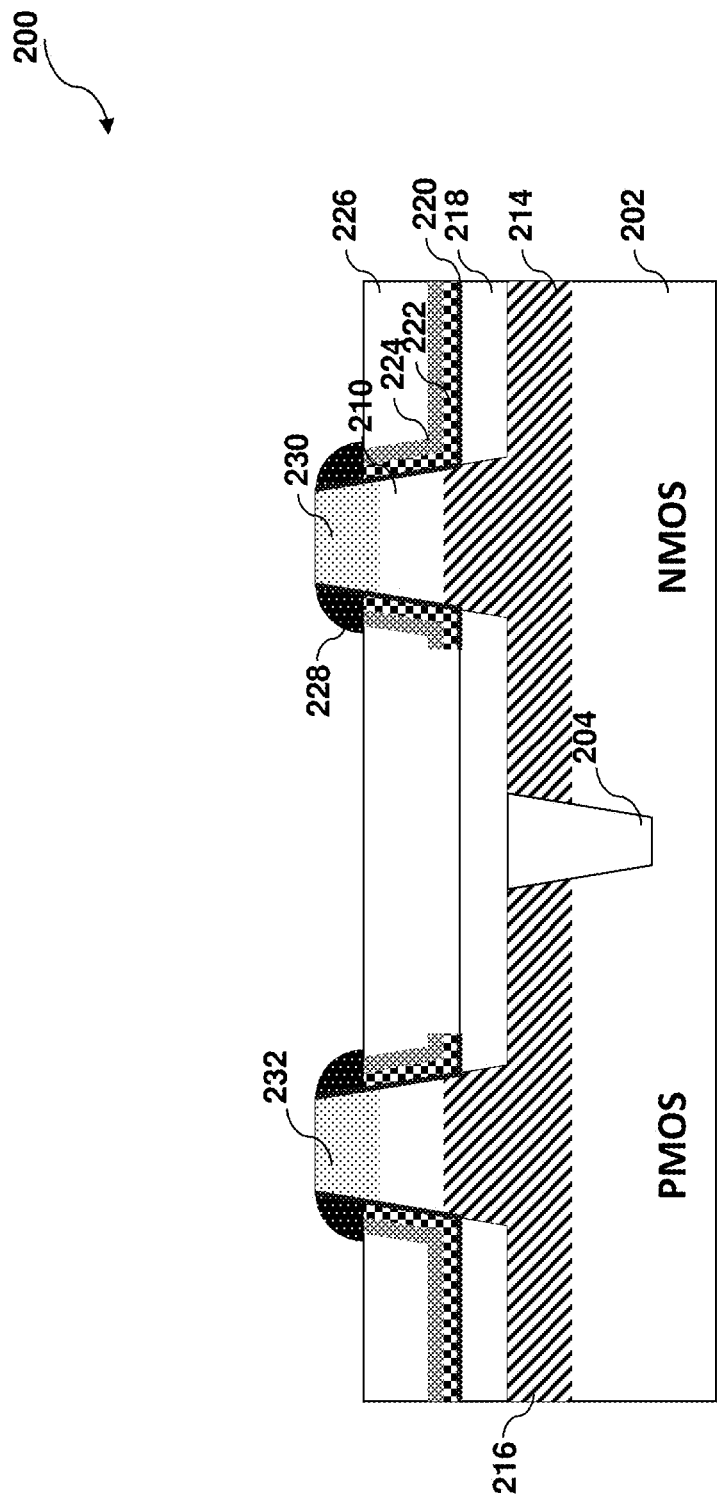

As shown in FIG. 1, the method 100 may proceed along different routes to form a source of the NMOS and the PMOS according to one or more embodiments of the present disclosure. The method may proceed to step 122 by forming a source of the NMOS and a source of the PMOS. FIGS. 19-21 are cross sectional views of forming a source of the device 200 using the method 100 for implementing one or more embodiments. In one embodiment, the step 122 includes forming a P+ source 230 of the NMOS of the device 200 as shown in FIG. 19. The step 122 includes forming a resist pattern 208e over the substrate 202 to define a region of the P+ source 230 of the NMOS. This can be done using a lithography process. The step 122 also includes doping the P+ source 230 of the NMOS. This can be done using an ion implantation process. An ion implantation energy can control a depth of the P+ source 230 of the NMOS at a top portion of the vertical conical frustum 210 ensuring the GAA overlapping with the P+ source 230 of the NMOS as shown in FIG. 19. The GAA is protected by the sidewall spacer 228. The step 122 also includes stripping the resist pattern 208e using a cleaning process after the doping process.

In another embodiment, the step 122 includes forming a N+ source 232 of the PMOS of the device 200 as shown in FIG. 20. The step 122 includes forming a resist pattern 208f over the substrate 202 to define a region of the N+ source 232 of the PMOS using a lithography process. The step 122 also includes doping the N+ source 232 of the PMOS using an ion implantation process. An ion implantation energy can control a depth of the N+ source 232 of the PMOS at a top portion of the vertical conical frustum 210 ensuring the GAA overlapping with the N+ source 232 of the PMOS as shown in FIG. 20. The GAA is protected by the sidewall spacer 228. The step 122 also includes stripping the resist pattern 208f using a cleaning process after the doping process. The step 122 further includes activating the P+ source 230 of the NMOS or the N+ source 232 of the PMOS using an anneal process, for example, a laser anneal (LSA) process to form the device 200 as shown in FIG. 21.

Figure 22:
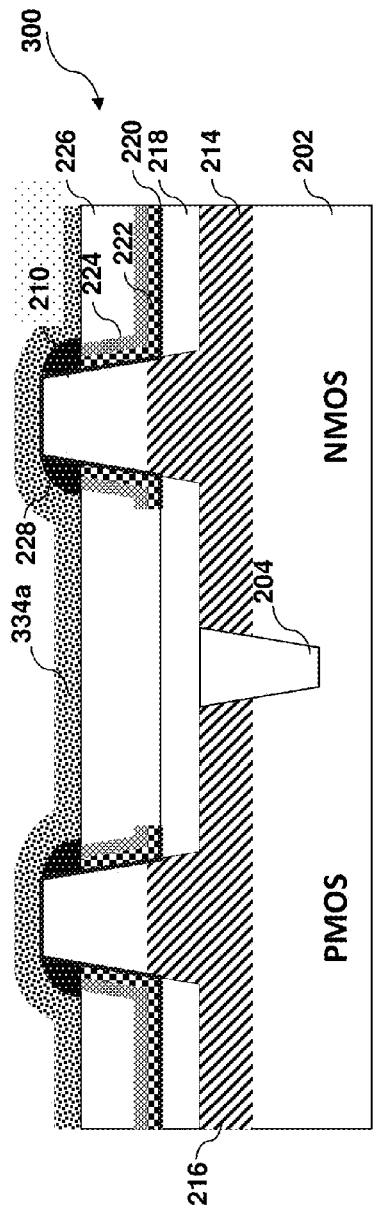
FIGS. 22-29 are cross sectional views of fabricating a device for implementing one or more embodiments of the present disclosure.
Figure 23:
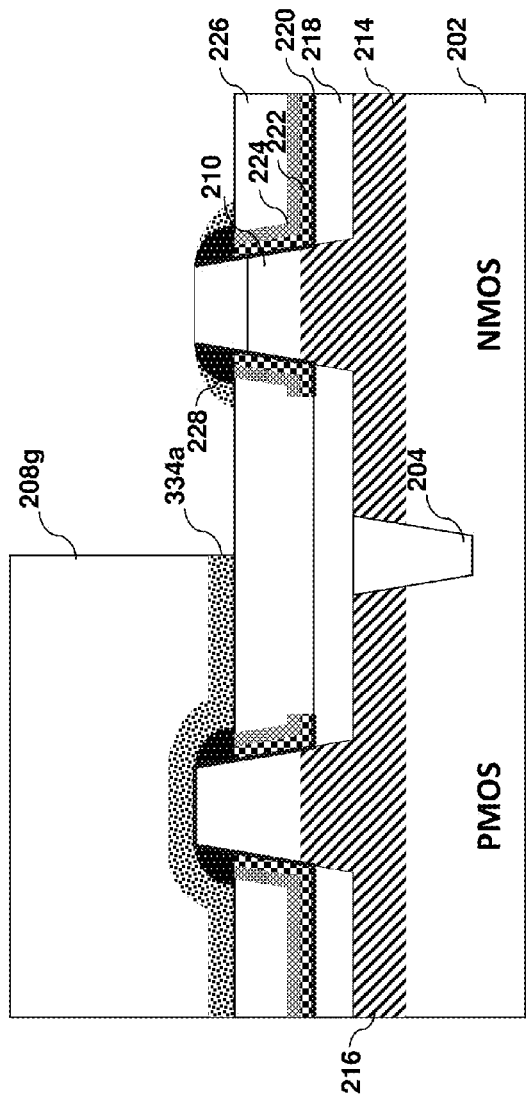
Figure 24:
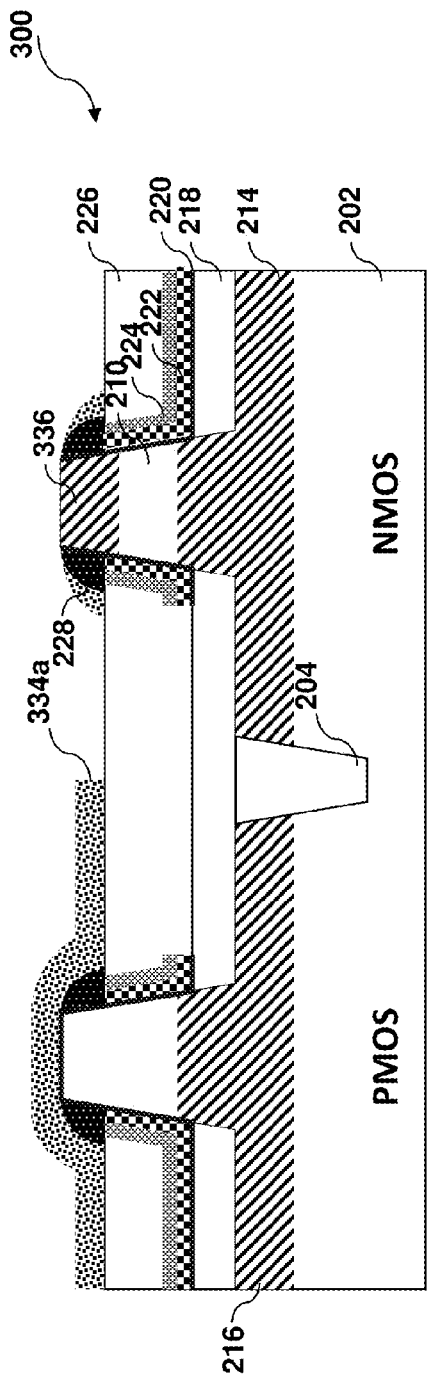
Figure 25:
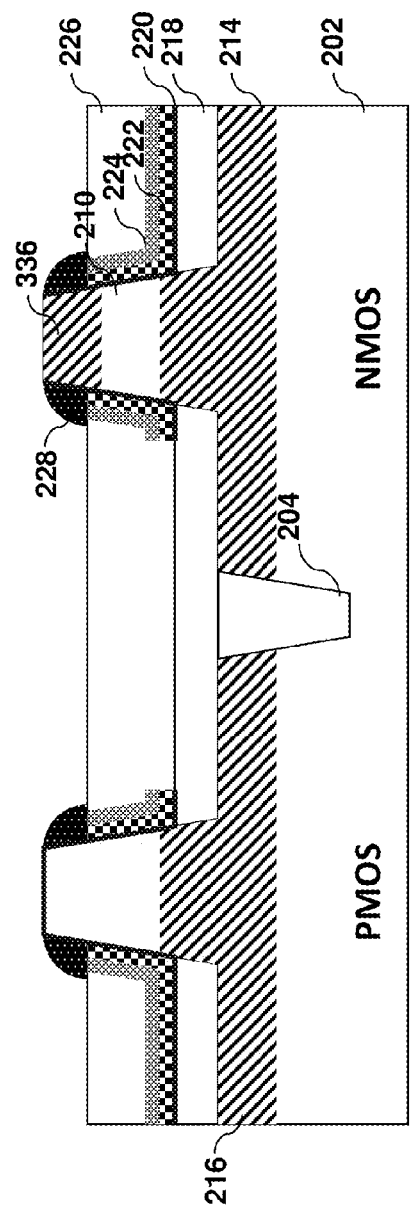

As shown in FIG. 1, the method 100 proceeds to step 126 by forming a source of the NMOS and a source of the PMOS. FIGS. 22-29 are cross sectional views of forming a source of a device 300 using the method 100 for implementing one or more embodiments. In one embodiment, the step 126 includes forming a P+ Ge source 336 of the NMOS of the device 300 as shown in FIGS. 22-25. The step 126 includes depositing a dummy layer 334a over the wafer substrate 202 as shown in FIG. 22. The dummy layer 334a may include an oxynitride (SiON) layer. The step 126 also includes forming a resist pattern 208g over the wafer substrate 202 as shown in FIG. 23. The step 126 further includes removing the dummy layer 334a at the NMOS area using an etching process. The step 126 further includes removing a portion of silicon at the top of the vertical conical frustum 210 using a recess etching process as shown in FIG. 23. As shown in FIG. 23, a horizontal surface of remaining silicon is lower than a horizontal surface of the second oxide layer 226 ensuring that the GAA overlaps with the source. The step 126 includes stripping the resist pattern 208g using a cleaning process. The step 126 also includes performing a Ge epitaxial (EPI) growth with an in-site P+ ion implantation process to form the P+ Ge source 336 at the top portion of the vertical conical frustum 210 as shown in FIG. 24. The step 126 includes removing the remaining dummy layer 334a on the wafer substrate 202 using an etching process to form the P+ Ge source 336 of the NMOS of the device 300 as shown in FIG. 25. Other III-V materials may replace Ge to form the P+ source 336. More III-V candidates for P+ source include InAs and InSb.

Figure 26:
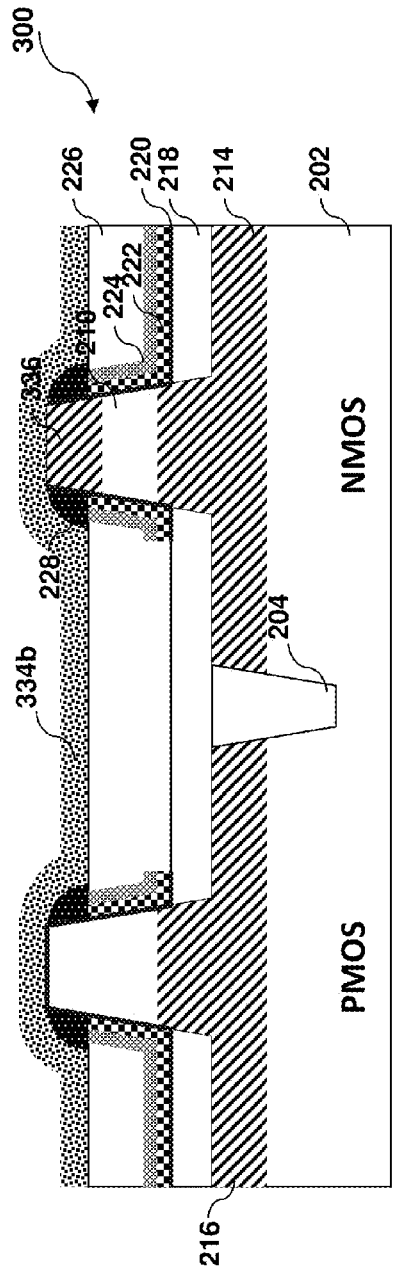
Figure 27:
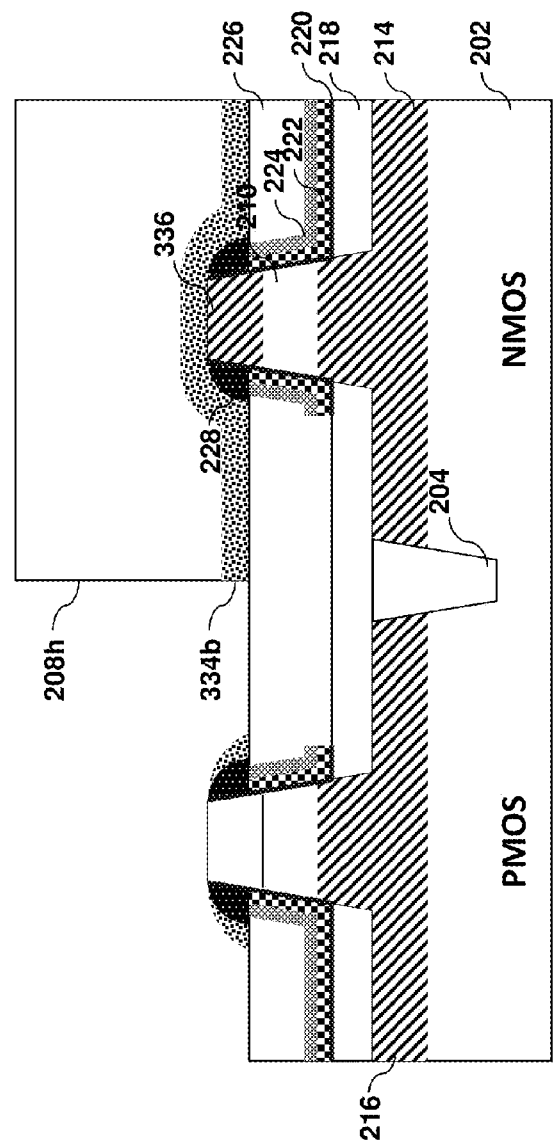
Figure 28:
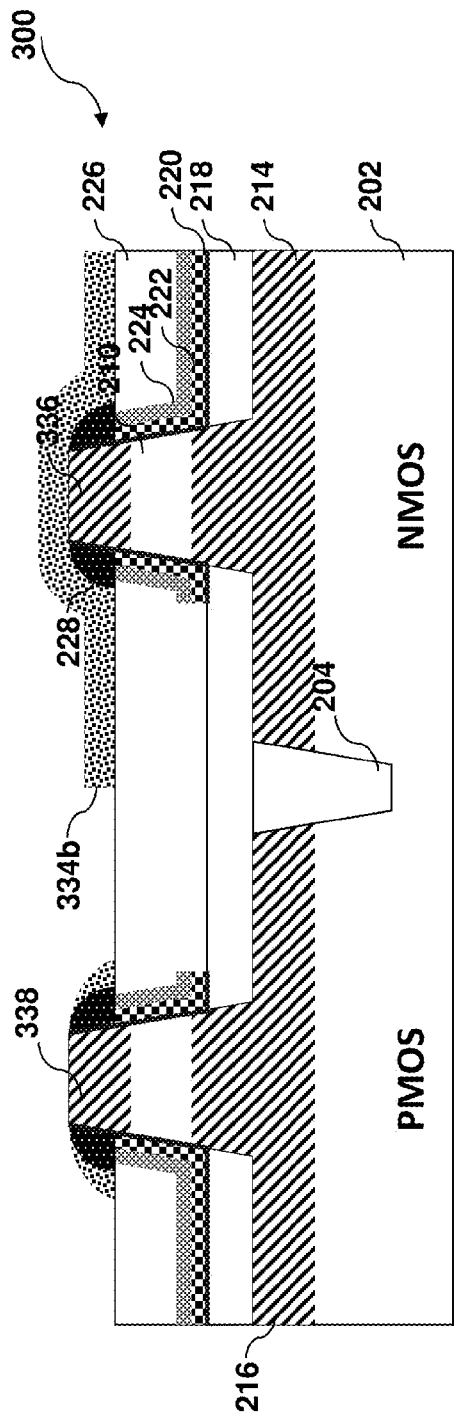
Figure 29:
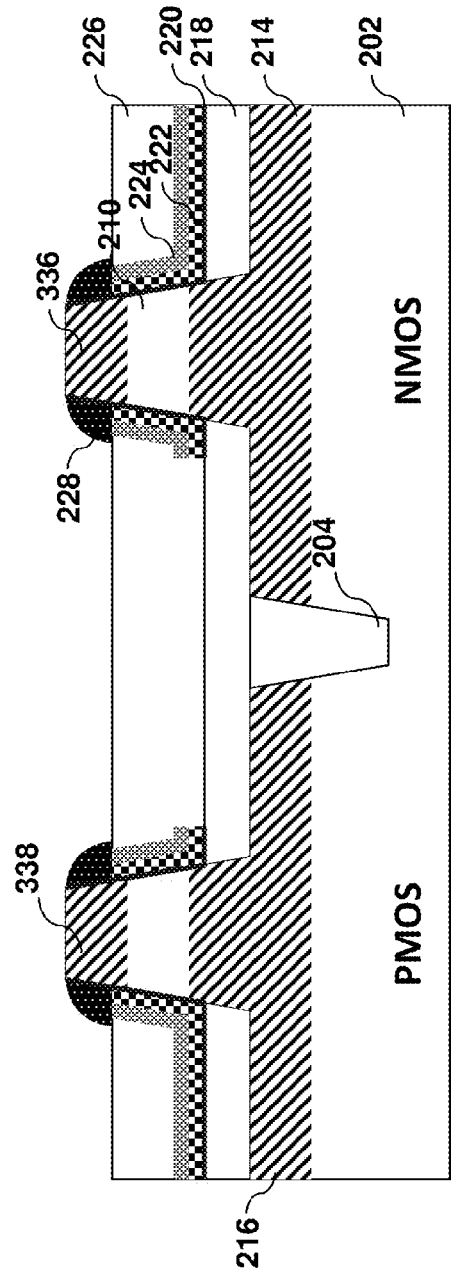

In another embodiment, the step 126 includes forming a N+ InAs source 338 of the PMOS of the device 300 as shown in FIGS. 26-29. The step 126 includes depositing a dummy layer 334b over the wafer substrate 202 as shown in FIG. 26. The step 126 also includes forming a resist pattern 208h over the wafer substrate 202 as shown in FIG. 27. The step 126 further includes removing the dummy layer 334b at the PMOS area using an etching process. The step 126 furthermore includes removing a portion of silicon at top of the vertical conical frustum 210 using a recess etching process as shown in FIG. 27. As shown in FIG. 27, a horizontal surface of remaining silicon is lower than a horizontal surface of the second oxide layer 226 ensuring the GAA overlapping with the source. The step 126 includes stripping the resist pattern 208h using a cleaning process. The step 126 also includes performing a InAs EPI growth with an in-site N+ ion implantation process to form the N+ InAs source 338 at the top portion of the vertical conical frustum 210 as shown in FIG. 28. The step 126 includes removing the remaining dummy layer 334b on the wafer substrate 202 using an etching process to form the N+ InAs source 338 of the NOMS of the device 300 as shown in FIG. 29. Other III-V materials may replace InAs to form the N+ source 338. More III-V candidates for N+ source include InAs, InGaAs, InSb, AlGaSb, AlGaAsSb.

Figure 30:
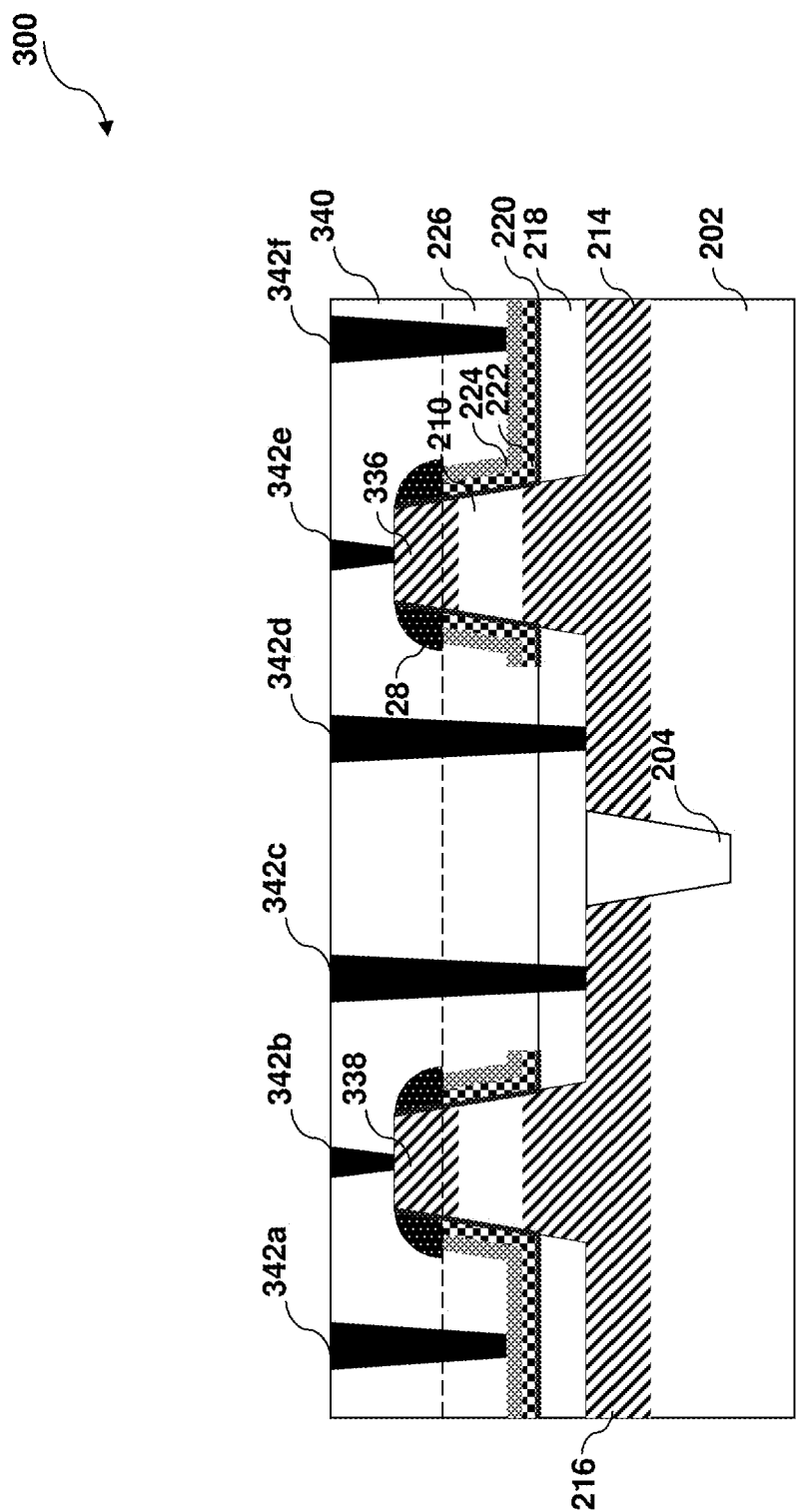
FIG. 30 is a cross sectional view of fabricating a device for implementing one or more embodiments of the present disclosure.

In some embodiments, the method 100 proceeds to step 132 by forming a contact structure as shown in FIG. 30. The step 132 includes depositing a third oxide layer 340 over the wafer substrate 202 as shown in FIG. 30. The step 132 also includes preforming a CMP process to smooth a surface of the third oxide layer 340. The step 132 further includes forming a contact hole through the third oxide layer 340, the second oxide layer 226, or the first oxide layer 218 using a lithography process and an etching process. The step 132 furthermore includes filling the contact hole with a barrier layer and a metal to form metal plugs 342a-f contacting the GAA, the drain, and the source respectively as shown in FIG. 30. The step 132 also includes performing a CMP process after filling the contact holes. The step 132 by forming the contact structure can be used on the device 200 as shown in FIG. 25 or on the device 300 as shown in FIG. 29. In some embodiments, the metal plugs 342a-f include a metal or a metal alloy.

As show in FIG. 1, the method 100 may proceed to step 134 by finishing forming a device. The step 134 may include connecting a resist sheet or a capacitor. The step 134 also includes connecting a plurality of cells to form an integrated circuit (IC). The step 134 may include depositing a passivation layer for protecting the device. The step 134 may include a plurality of inspections assuring the device quality and performance. Additional steps can be provided before, during, and after the method 100, and some the steps described can be replaced, eliminated, or moved around for additional embodiments of the method 100.

In the foregoing discussion, by fabricating the device 200 and the device 300, various processes, such as a film deposition process, a lithography process, an etching process, an ion implantation process, a CMP process, and a cleaning process, are performed. In the present embodiments, the film deposition process includes depositing a physical vapor deposition (PVD) process such as evaporation and DC magnetron sputtering, a plating process such as electrode-less plating or electroplating, a chemical vapor deposition (CVD) process such as atmospheric pressure CVD (APCVD), a low pressure CVD (LPCVD), a plasma enhanced CVD (PECVD), or a high density plasma CVD (HDP CVD), an ion beam deposition, spin-on coating, a metal-organic decomposition (MOD), an atomic layer deposition (ALD) process and/or other suitable methods.

In some embodiments, the lithography process may include coating a resist film on a wafer substrate, exposing the resist film deposited on the wafer substrate by an optical lithography tool or an electron beam writer, and developing the exposed resist film to form a resist pattern for an ion implantation process or an etching process. The coating the resist film on the wafer substrate includes performing a dehydration process before applying the resist film on the wafer substrate, which can enhance an adhesion of the resist film to the wafer substrate. The dehydration process may include baking the substrate at a high temperature for a duration of time, or applying a chemical such as hexamethyldisilizane (HMDS) to the substrate. The coating the resist film on the wafer substrate may include a soft bake (SB). The exposing the resist film deposited on the wafer substrate includes using a mask. The mask may be a binary mask (BIM), a super binary mask (SBIM), or a phase shift mask (PSM), which includes an alternative phase shift mask (alt. PSM) or an attenuated phase shift mask (att. PSM). The optical lithography tool may include an I-line, a deep ultraviolet (DUV), or an extreme ultraviolet (EUV) tool. Developing the exposed resist film may include a post exposure bake (PEB), a post develop bake (PDB) process, or a combination thereof.

The etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Thus, the present disclosure describes a device. In one embodiment, the device includes a wafer substrate, a conical frustum structure formed in the wafer substrate, and a gate all-around (GAA) structure circumscribing the middle portion of the conical frustum structure. The conical frustum structure includes a drain formed at a bottom portion of the conical frustum, a source formed at a top portion of the vertical conical frustum, and a channel formed at a middle portion of the conical frustum connecting the source and the drain. The GAA structure overlaps with the source at one side of the GAA structure, crosses over the channel, and overlaps with the drain at another side of the GAA structure. The device further includes a plurality of metal plugs contacting with the GAA structure, the source and the drain. The GAA structure includes a interfacial layer (IL) deposited on side wall of the conical frustum structure, a metal gate layer deposited over the IL, and a poly gate layer deposited over the metal gate layer. The IL includes an oxide layer. The IL may include a high-k dielectric layer. The drain includes a negative charge (N+) drain or a positive charge (P+) drain. The source includes a P+ source or a N+ source. The source may further include a P+ Ge source. The source may further include a N+ InAs source.

In another embodiment, the device includes a wafer substrate, a conical frustum structure formed in the wafer substrate, and a gate all-around (GAA) structure circumscribing the middle portion of the conical frustum structure, overlapping with the drain at a bottom portion of the conical frustum structure, and overlapping with the source at a top portion of the conical frustum structure. The conical frustum structure includes a drain formed at a bottom portion of the vertical conical frustum, a channel formed over the drain at a middle portion of the vertical conical frustum connecting the source, and a source formed over the channel at a top portion of the vertical conical frustum. The GAA structure includes structure includes a interfacial layer (IL) deposited on side wall of the conical frustum structure, a metal gate layer deposited over the IL, and a poly gate layer deposited over the metal gate layer. The device further includes a plurality of metal plugs contacting with the GAA structure, the source and the drain, wherein the metal includes a metal or a metal alloy.

The present disclosure also describes a method of fabricating a device. In one embodiment, the method includes receiving a wafer substrate, forming a conical frustum structure with the hard mask layer on top of the conical frustum structure, forming a drain at a bottom portion of the conical frustum structure, forming a gate all around (GAA) structure surrounding a middle portion of the vertical conical frustum structure, and forming a source at top portion of the vertical conical frustum structure. The method further includes forming a plurality of metal plugs connecting the GAA structure, the source, and the drain. Forming the drain includes forming a negative charge (N+) drain or a positive charge (P+) drain. Forming the GAA structure includes depositing a first oxide over the wafer substrate, etching portion of the first oxide layer, depositing an interfacial layer (IL) over the partially etched first oxide layer, depositing the metal gate layer over the IL, and depositing the poly gate over the metal gate so that the GAA structure circumscribes the conical frustum and overlaps with the drain at bottom portion of the vertical conical frustum. The method further includes removing the IL, the metal gate layer, and the poly gate layer at a top portion of the conical frustum so that the middle portion of the conical frustum is circulated by the GAA structure. The method further includes forming a spacer surrounding the top portion of the vertical conical frustum. Forming the source includes forming a P+ source or a N+ source. Forming the P+ source includes forming a P+ Ge source. Forming the N+ source includes forming a N+ InAs source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, the terms "source" and "drain" are intended to be interchangeable, in that they are merely used to reference opposite nodes of a transistor between which a channel can be formed. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, the device comprising: a wafer substrate; a conical frustum structure formed in the wafer substrate, wherein the conical frustum structure includes a drain formed at a bottom portion of the conical frustum, a source formed at a top portion of the vertical conical frustum, and a channel formed at a middle portion of the conical frustum connecting the source and the drain; and a gate all-around (GAA) structure circumscribing the middle portion of the conical frustum structure, wherein the GAA structure overlaps with the source at one side of the GAA structure, crosses over the channel, and overlaps with the drain at another side of the GAA structure, the GAA structure including an interfacial layer (IL) and a metal gate layer deposited over the IL, and a poly gate layer deposited over the metal gate layer of the GAA structure.

2. The device of claim 1, further comprising a plurality of metal plugs contacting with the GAA structure, the source and the drain.

3. The device of claim 1, wherein the IL includes an oxide layer.

4. The device of claim 3, further comprising a high-k dielectric layer.

5. The device of claim 1, wherein the drain includes a negative charge (N+) drain or a positive charge (P+) drain.

6. The device of claim 1, wherein the source includes a P+source or a N+source.

7. The device of claim 6, further comprising a P+Ge source.

8. The device of claim 6, further comprising a N+InAs source.

9. A device, the device comprising:
a wafer substrate;
a conical frustum structure formed in the wafer substrate, wherein the conical frustum structure includes a drain formed at a bottom portion of the conical frustum, a channel formed over the drain at a middle portion of the conical frustum, and a source formed over the channel at a top portion of the vertical conical frustum; and
a gate all-around (GAA) structure circumscribing the middle portion of the conical frustum structure, overlapping with the drain at the bottom portion of the conical frustum structure, and overlapping with the source at the top portion of the conical frustum structure, wherein the GAA structure includes an interfacial layer (IL) deposited on sidewalls of the conical frustum structure, a gate layer deposited over the IL, and a poly gate layer deposited over the metal gate layer.

10. The device of claim 9, further comprising a plurality of metal plugs contacting with the GAA structure, the source and the drain, wherein the metal includes a metal or a metal alloy.

11. A semiconductor device comprising:
a wafer substrate;
a conical frustum structure formed in the wafer substrate, wherein the conical frustum structure includes a drain formed at a bottom portion of the conical frustum, a source formed at a top portion of the vertical conical frustum, and a channel formed at a middle portion of the conical frustum connecting the source and the drain; and
a gate all-around (GAA) structure circumscribing the middle portion of the conical frustum structure, wherein the GAA structure overlaps with the source at one side of the GAA structure, crosses over the channel, and overlaps with the drain at another side of the GAA structure, the GAA structure including an interfacial layer (IL) and a poly gate layer.

12. The device of claim 11, further comprising a plurality of metal plugs contacting the GAA structure, the source and the drain.

13. The device of claim 11, further comprising a metal gate layer of the GAA structure formed between the interfacial layer and the poly gate layer.

14. The device of claim 11, wherein the IL includes an oxide layer.

15. The device of claim 14, further comprising a high-k dielectric layer.

16. The device of claim 11, wherein the drain includes a negative charge (N+) drain or a positive charge (P+) drain.

17. The device of claim 11, wherein the source includes a P+source or a N+source.

18. The device of claim 17, further comprising a P+Ge source.

19. The device of claim 17, further comprising a N+InAs source.

* * * * *